(12) United States Patent
Lu

(10) Patent No.: US 11,438,015 B2
(45) Date of Patent: Sep. 6, 2022

(54) TWO-LEVEL ERROR CORRECTING CODE WITH SHARING OF CHECK-BITS

(71) Applicant: Taiwan Semiconductor Manufacturing Company, Ltd., Hsinchu (TW)

(72) Inventor: Shih-Lien Linus Lu, Hsinchu (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 0 days.

(21) Appl. No.: 16/925,361

(22) Filed: Jul. 10, 2020

(65) Prior Publication Data

US 2022/0014213 A1 Jan. 13, 2022

(51) Int. Cl.
*H03M 13/29* (2006.01)
*G11C 29/42* (2006.01)
*G11C 29/44* (2006.01)
*H03M 13/11* (2006.01)
*H03M 13/15* (2006.01)

(52) U.S. Cl.
CPC ............ *H03M 13/29* (2013.01); *G11C 29/42* (2013.01); *G11C 29/44* (2013.01); *H03M 13/1174* (2013.01); *H03M 13/1575* (2013.01)

(58) Field of Classification Search
CPC ... H04L 1/007; H03M 13/29; H03M 13/1575; H03M 13/1174; G11C 29/42; G11C 29/44; G06F 11/1012; G06F 11/1044; G06F 11/1048
See application file for complete search history.

(56) References Cited

U.S. PATENT DOCUMENTS

| | | | | |
|---|---|---|---|---|
| 4,525,838 A * | 6/1985 | Patel | ................... | G11B 20/1809 714/755 |
| 5,268,908 A * | 12/1993 | Glover | ................... | H03M 13/29 714/761 |
| 5,987,627 A * | 11/1999 | Rawlings, III | ........ | G06F 3/0613 711/100 |
| 6,275,965 B1 * | 8/2001 | Cox | ................... | G11B 20/1833 714/755 |
| 6,662,333 B1 * | 12/2003 | Zhang | ................. | G06F 11/1044 714/767 |
| 7,895,502 B2 * | 2/2011 | Han | ..................... | G06F 11/1012 714/764 |
| 8,225,171 B2 * | 7/2012 | Park | .................... | G06F 11/1012 714/758 |
| 8,234,545 B2 * | 7/2012 | Shalvi | ................. | G06F 11/1068 714/768 |

(Continued)

*Primary Examiner* — Steve N Nguyen
(74) *Attorney, Agent, or Firm* — Merchant & Gould P.C.

(57) ABSTRACT

A memory device includes: a memory device configured to store data bits to be written to the memory device; and a memory controller. The memory controller includes: a first level error correction code (ECC) circuit coupled to the memory device, wherein the first level ECC circuit is configured to generate a first plurality of first level check bits corresponding to the data bits based on a first error detection scheme; and a second level ECC circuit coupled to the memory device, wherein the second level ECC circuit is configured to generate a second plurality of second level check bits corresponding to both the data bits and the first plurality of first level check bits based on a first error correction scheme.

20 Claims, 8 Drawing Sheets

(56) References Cited

U.S. PATENT DOCUMENTS

| | | | |
|---|---|---|---|
| 2009/0210774 A1* | 8/2009 | Godard | G06F 11/1068 714/801 |
| 2012/0159283 A1* | 6/2012 | Lu | H03M 13/09 714/763 |
| 2014/0047306 A1* | 2/2014 | Perego | G06F 11/1666 714/799 |
| 2017/0177432 A1* | 6/2017 | Fader | G06F 11/1048 |

* cited by examiner

TWO-LEVEL ERROR CORRECTING CODE WITH SHARING OF CHECK-BITS

BACKGROUND

Memory is widely used to store information (both data and program) in a digital system. During the operation of the system, information (bits) stored in the memory may be corrupted due to various reasons. One possible cause of the corruption is due to environmental events both internal to the memory and outside of the memory. One such outside event is a particle strike. There are other reasons which cause the corruption (failure) of bits besides environmental events. When a bit is corrupted, information stored is lost resulting system failure or data lost. Therefore it is important to protect the integrity of the memory content. Various means for protecting the memory content from corruption have been used. Error correction codes (ECC) have the advantage of being able to detect errors in a codeword (both the data bits and the check bits), and also to correct errors.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion. In addition, the drawings are illustrative as examples of embodiments of the invention and are not intended to be limiting.

DETAILED DESCRIPTION

Figure 1:
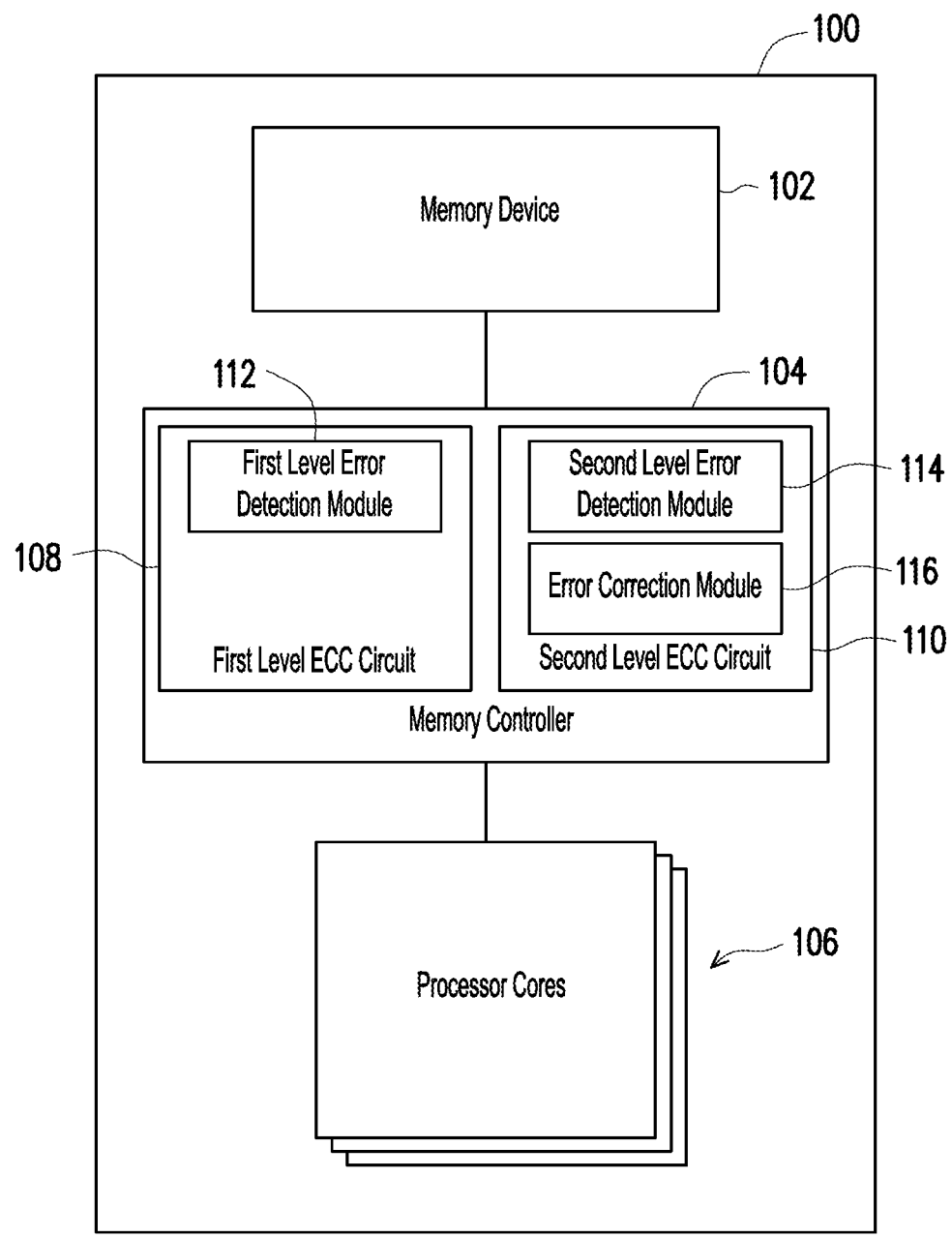
FIG. 1 is a block diagram generally illustrating an example apparatus in accordance with some embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Memory devices are used to store information in semiconductor devices and systems. The popular dynamic random access memory (DRAM) cell includes a switch and a capacitor. DRAMs do not retain data when power is cut off. A nonvolatile memory device is capable of retaining data even after power is cut off. Examples of nonvolatile memory devices include the flash memory, magnetic random access memories (MRAMs), ferroelectric random access memories (FRAMs), resistive random access memories (RRAMs), and phase-change random access memories (PRAMs). MRAMs, FRAMs, RRAMs, and PRAMs are sometimes referred to as "emerging memories". MRAMs store data using variations in the magnetization direction at tunnel junctions. FRAMs store data using polarization characteristics of ferroelectricity. RRAMs store data using variations in resistance of a resistive material layer. PRAMs store data using resistance variations caused by phase changes of specific materials.

Memory is typically arranged in a 2-dimensional array. A memory array may be a device of itself or embedded in another device, and can also include many memory bit cells. Each memory bit cell can typically store one bit of information. A memory macro may include one or more arrays of bit cells and other logic circuitry such as drivers, buffers, clock fan out circuits, error correction codes (FCC) circuits, and other peripheral circuitry.

Data errors, such as soft errors that are not permanent or representative of physical damage to the device may result from disturb errors, radiation effects, or thermal effects, among others. Such errors may be deterministic, or may be by stochastic processes. Data error rates, including soft errors, may require the use of error correction code (ECC) schemes built into the memory device chip. ECC can be used to detect and correct bit errors stored in a memory. ECC encodes data by generating ECC check bits, e.g., redundancy bits or parity bits, which are stored along with the data in a memory device. Data bits and check (e.g., parity) bits together form a codeword. For example, an ECC that generates 8 parity bits for 64 bits of data can usually detect two bit errors and correct one bit error in the 64 bits of data, known as a DED/SEC code, meaning double-error detecting (DED) and single-error correcting (SEC).

Additional memory space may be required to store the check bits used with an ECC. Thus, an additional memory device or devices (e.g. additional chip or chips) may be required to store check bits for providing ECC capability. In some memory arrays, additional columns may be added to the memory array to store the check bits. Data included in one row of a memory array may be referred to as a word, and a codeword includes the word plus parity bits added on in the additional column(s). If a codeword includes a word portion with K bits and M parity bits, the codeword length N would be N=K+M. For example, an ECC memory that can provide 8-bit parity for each 32-bit data word may include a 40-bit wide interface to access a 40-bit codeword with 32-bit data. Similarly, an ECC memory that can provide 8-bit parity for each 64-bit data word may include a 72-bit wide interface to access a 72-bit codeword with 64-bit data.

In accordance with disclosed embodiments, a two-level ECC memory controller may protect smaller words with error detection only and protect larger words with both error detection and error correction. Detection of bit errors in a codeword requires fewer operations than bit error correction, and as such requires less circuitry to support the fewer operations. As a result, a two-level ECC memory controller can achieve a relatively small overhead, minimize additional latency added by ECC, and provide more floor planning flexibility. Additionally, sharing of check bits among the first level ECC and the second level ECC can further reduce the overhead.

FIG. 1 is a block diagram generally illustrating an example apparatus in accordance with some embodiments. In the illustrated example in FIG. 1, the apparatus 100 includes, among other things, a memory device 102, a memory controller 104, and one or more processor cores 106.

The memory device 102 may be computer components and recording media used to keep digital data. In one example, the memory device 102 may be processor registers and cache. In one example, the memory device 102 may be in the form of online mass storage device, such as a hard drive as a secondary storage. Online mass storage device may include non-volatile memory which may come in various forms, including but not limited to NAND (flash) memory, emerging memories such as MRAMs, FRAMs, RRAMs, and PRAMs. In one example, the memory device 102 may be in the form of an off-line bulk storage device, such as a DVD-ROM as a tertiary storage. In one example, the memory device 102 may be dynamic random access memories (DRAMs). In one example, the memory device 102 may be static random access memories (SRAMs).

The memory controller 104 may be configured to provide an interface to the memory device 102 and manage the flow of data going to and from the memory device 102. In one example, the memory controller 104 may be in the form of a separate chip. In one example, the memory controller 104 may be integrated with the memory device 102. In one example, the memory controller 104 may be implemented on a motherboard or form an integrated memory controller (IMC) on the microprocessor to potentially reduce memory latency.

In the illustrated example in FIG. 1, the memory controller 104 includes, among other things, a first level ECC circuit 108 and a second level ECC circuit 110. The first level ECC circuit 108 includes, among other things, a first level error detection module 112. The first level ECC circuit 108 is configured to detect errors associated with smaller words during transmission or storage. The width of a smaller word, for example, may be the width of a physical array. In one example, the width of a smaller word is 64-bit, corresponding to the width of a physical array. The second level ECC circuit 110 includes, among other things, a second level error detection module 114 and an error correction module 116. The second level ECC circuit 110 is configured to detect and correct errors associated with larger words during transmission or storage. The width of a larger word, for example, may be the width of a logical data size such as a cache line. A cache line is the unit of data transfer between a cache and a main memory. In one example, the width of a larger word is 512-bit, corresponding to the width of a cache line. It should be noted that "smaller words" and "larger words" are relative terms, and the width of a larger word is larger than the width of a smaller word.

Many schemes have been developed to implement ECC, including Hamming codes, triple modular redundancy, and others. Hamming codes, for example, are a class of binary linear block codes that, depending on the number of parity bits utilized, other can detect up to two bit errors per codeword, or correct one bit error without detection of uncorrected errors. Several schemes have been developed, but in general, if parity bits are arranged within a codeword such that different incorrect bits produce different error results, the bits in error can be identified.

When designing an ECC, two codewords should be sufficiently dissimilar so that corruption of a single bit (or possibly several bits) does not turn one valid codeword into another valid codeword. Hamming distance is a measure of the distance between two codewords. A Hamming distance is the number of bits that differ between two codewords.

To design a code that can detect d single-bit errors, the minimum Hamming distance for codewords is (d+1), because no set of d single-bit errors can turn one valid codeword into another valid codeword. On the other hand, to design a code that can correct d single-bit errors, a minimum Hamming distance for codewords is (2d+1). As such, the valid codewords are so far apart that even d single-bit errors occur, it is still less than half the Hamming distance.

If the word portion of a codeword has K bits, M parity bits are needed to encode the K bits by Hamming codes. The codeword has (K+M) bits. One additional bit is used to indicate the no-error state. Thus, there are (K+M+1) possible different locations where an error may occur. On the other hand, M parity bits can indicate $2^M$ states. Therefore, M is the smallest integer that satisfies the inequality below.

$$2^M \geq K+M+1.$$

In general in a two-level ECC, the number of check bits needed for an error detection scheme in the first level ECC is determined based on the number of data bits to be written to the memory and the error detection scheme, and the number of check bits needed for an error correction scheme in the second level ECC is determined based on the number of data bits to be written to the memory, the number of check bits for the first level ECC, and the error correction scheme. For example, if Hamming codes are used and 64 data bits (i.e., an example width of a physical array) are to be written to the memory, meaning K is 64 in the inequality above, then 7 check bits are used for the first level ECC. In other words, if K is 64, then M is calculated to be 7 according to the inequality above.

In one example, a DED/DEC scheme, meaning double-error detecting (DED) and double-error correcting (DEC), may be employed. Specifically, the first level ECC circuit 108 can protect 64 data bits (i.e., an example width of a physical array) with DED, and 7 check bits are used for the first level, as explained above. The second level ECC circuit 110, on the other hand, can protect 512 data bits (i.e., an example width of a cache line, and 8 times of 64 data bits) and 56 check bits (i.e., 8 times of 7 check bits) with DEC, and 20 check bits are used for the second level. As such, there are 76 (i.e., 56 plus 20) check bits in total for the 512 bits of data, and the overhead (i.e., the ratio of the number of check bits to the number of data bits) is 14.8% in this example.

In another example, a SED/SEC scheme, meaning single-error detecting (SED) and single-error correcting (SEC), may be employed. Specifically, the first level ECC circuit 108 can protect 64 data bits (i.e., an example width of a physical array) with SED, and 1 check bit is used for the first level. The second level ECC circuit 110, on the other hand, can protect 512 data bits (i.e., an example width of a cache line, and 8 times of 64 data bits) and 8 check bits (i.e., 8 times of 1 check bit) with SEC, and 20 check bits are used for the second level. As such, there are 28 (i.e., 8 plus 20) check bits in total for the 512 bits of data, and the overhead is 5.47% in this example.

In yet another example, a SED/DEC scheme, meaning single-error detecting (SED) and double-error correcting (DEC), may be employed. Specifically, the first level ECC circuit 108 can protect 16 data bits (i.e., another example width of a physical array) with SED, and 1 check bit is used for the first level. The second level ECC circuit 110, on the other hand, can protect 512 data bits (i.e., an example width of a cache line, and 32 times of 16 data bits) and 32 check bits (i.e., 32 times of 1 check bit) with DEC, and 20 check bits are used for the second level. As such, there are 52 (i.e., 32 plus 20) check bits in total for the 512 bits of data, and the overhead is 10.16% in this example.

In yet another example, a TED/TEC scheme, meaning triple-error detecting (TED) and triple-error correcting (TEC), may be employed. Specifically, the first level ECC circuit 108 can protect 64 data bits (i.e., an example width of a physical array) with TED, and 8 check bits are used for the first level. The second level ECC circuit 110, on the other hand, can protect 512 data bits (i.e., an example width of a cache line, and 8 times of 64 data bits) and 64 check bits (i.e., 8 times of 8 check bits) with TEC, and 30 check bits are used for the second level. As such, there are 94 (i.e., 64 plus 30) check bits in total for the 512 bits of data, and the overhead is 18.4% in this example.

In summary, the two-level ECC memory controller 104 protects smaller words with error detection only and protects larger words with both error detection and error correction. As a result, the two-level ECC memory controller 104 can achieve a relative small overhead, minimize additional latency added by ECC, and provide more floor planning flexibility. It should be noted that schemes other than the DED/DEC scheme, the SED/SEC scheme, the SED/DEC scheme, and the TED/TEC scheme may also be employed as needed.

In the illustrated example in FIG. 1, the processor cores 106 may have one or more central processing units (CPUs) or cores wherein each core can read and execute CPU instructions such as add, move, branch, read, write, and so on. With multiple cores integrated onto a single integrated circuit die or multiple dies in a single chip package, a multi-core processor is amenable to parallel computing, thus increasing overall computing speed.

Figure 2:
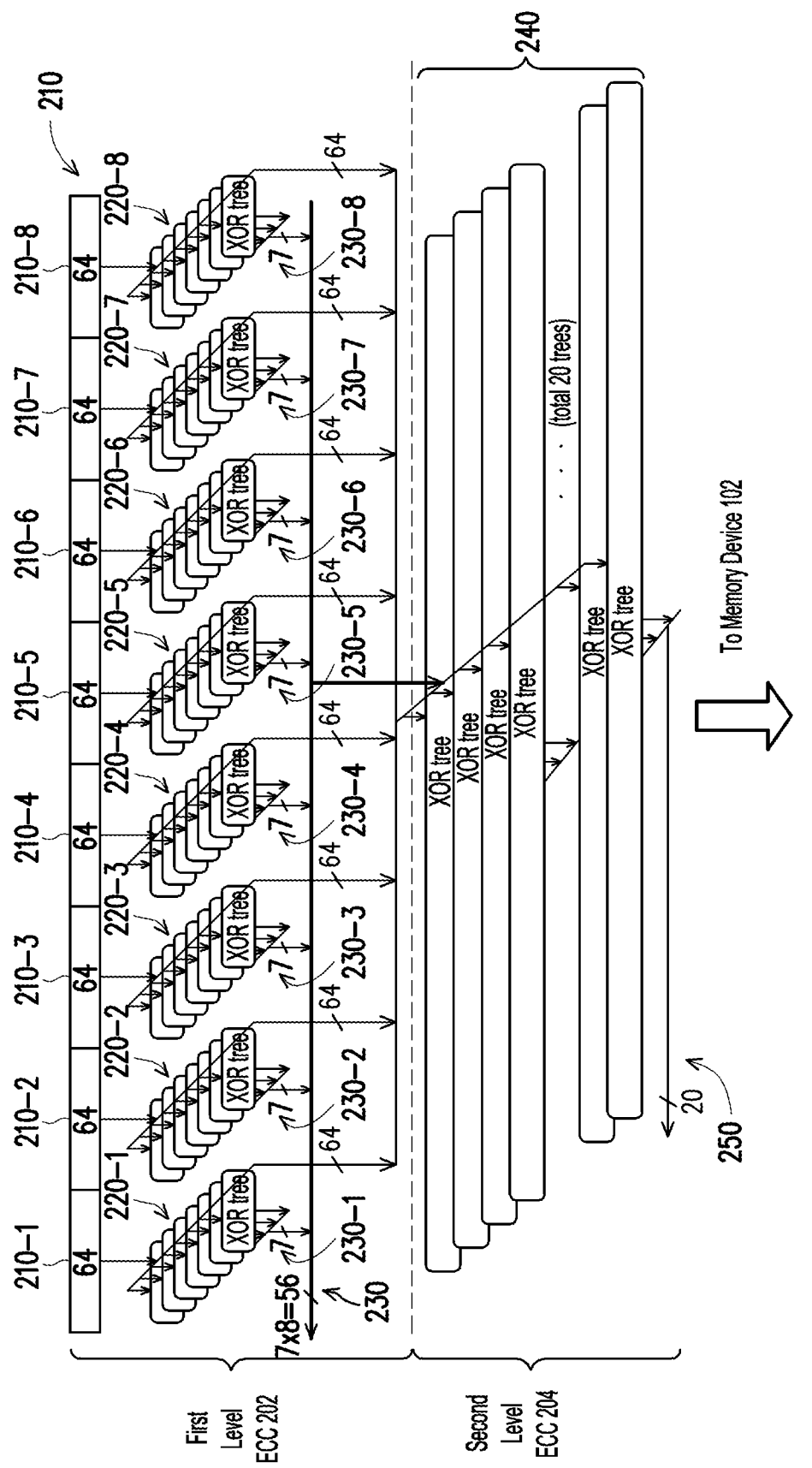
FIG. 2 is a diagram illustrating an example write operation of the memory controller with two-level ECC in accordance with some embodiments.

FIG. 2 is a diagram illustrating an example write operation of the memory controller 104 with two-level ECC in accordance with some embodiments. In general, the write operation occurs in two levels: a first level ECC 202 and a second level ECC 204, and check bits generated in the first level ECC 202, along with data bits, are further used to generate check bits in the second level ECC 204. Specifically, a DED/DEC which has been described above is employed. 512 data bits 210 are going to be written into the memory device 102. The 512 (i.e., eight times of 64) data bits 210 are divided into eight words 210-1 to 210-8, each word having 64 data bits which correspond to the width of a physical array.

Each of the eight words 210-1 to 210-8 is protected with DED, and 64 data bits use 7 check bits. Each of the eight words 210-1 to 210-8 is input into a respective group of write exclusive OR (XOR) trees to generate 7 first level check bits. Specifically, the word 210-1 is input into a group of write XOR trees 220-1, and 7 first level check bits 230-1 are generated; the word 210-2 is input into a group of write XOR trees 220-2, and 7 first level check bits 230-2 are generated; the word 210-3 is input into a group of write XOR trees 220-3, and 7 first level check bits 230-3 are generated; the word 210-4 is input into a group of write XOR trees 220-4, and 7 first level check bits 230-4 are generated; the word 210-5 is input into a group of write XOR trees 220-5, and 7 first level check bits 230-5 are generated; the word 210-6 is input into a group of write XOR trees 220-6, and 7 first level check bits 230-6 are generated; the word 210-7 is input into a group of write XOR trees 220-7, and 7 first level check bits 230-7 are generated; and the word 210-8 is input into a group of write XOR trees 220-8, and 7 first level check bits 230-8 are generated. As such, 56 first level check bits 230 are generated in total in the first level ECC 202. The 56 first level check bits 230 are written into the memory device 102. In one example, the 56 first level check bits 230 are written into separate columns of a memory array of the memory device 102.

In the second level ECC 204, the 56 first level check bits 230 along with the 512 data bits 210 are protected with DEC, and 568 bits (i.e., 56 bits plus 512 bits) use 20 check bits, as explained above. Specifically, the 56 first level check bits 230 along with the 512 data bits 210 are input into 20 write XOR trees 240. As such, 20 second level check bits 250 are generated in total in the second level ECC 204. The 20 second level check bits 250 are written into the memory device 102. In one example, the 20 second level check bits 250 are written into separate columns of the memory array of the memory device 102.

In summary, after the first level ECC 202 and the second level ECC 204, the 56 first level check bits 230 and the 20 second level check bits 250 are generated. The 56 first level check bits 230 and the 20 second level check bits 250, along with the 512 data bits 210, are written into the memory array of the memory device 102. As described above, the overhead is 14.8% in this example of DED/DEC scheme. In general, a first number of first level check bits are generated, and a second number of second level check bits are generated. The first number is determined based on two factors: (1) the data bits to be written to the memory device; and (2) the error detection scheme. The second number is determined based on three factors: (1) the data bits to be written to the memory device; (2) the number (i.e., the first number) of first level check bits; and (3) the error correction scheme.

Figure 3:
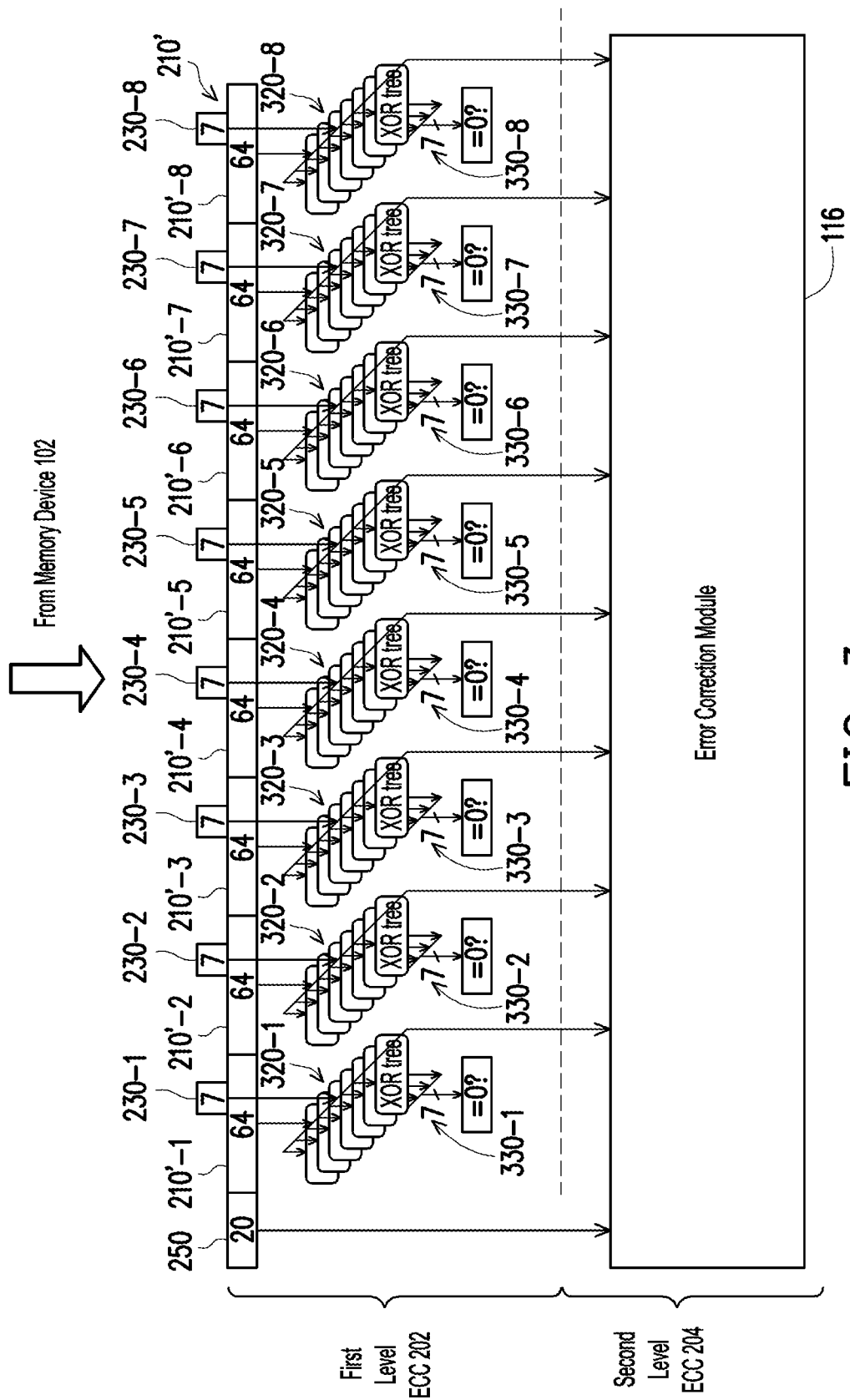
FIG. 3 is a diagram illustrating an example read operation of the memory controller with two-level ECC in accordance with some embodiments.

FIG. 3 is a diagram illustrating an example read operation of the memory controller 104 with two-level ECC in accordance with some embodiments. In general, the read operation occurs in two levels: the first level ECC 202 and the second level ECC 204. Each word is checked in the first level ECC 202. When there is no error for any word, the read operation is done. When there is any error for any word, the whole second level codeword (i.e., the data bits, the first level check bits generated in the write operation, and the second level check bits generated in the write operation) are read, and the error correction module 116 reconstructs the original data bits.

Specifically, 512 data bits 210' stored in the memory device 102 are read. The 512 data bits are not necessarily the same as the 512 data bits 210 originally to be written into the memory device 102 shown in FIG. 2, due to errors occurring in the write operation or data corruption of the memory device 102 over time. Similarly, the 512 data bits 210' can be divided into 8 words 210'-1 to 210'-8, each of which includes 64 data bits.

The 8 words 210'1 to 210'-8 along with respective first level check bits 230-1 to 230-8 generated in the write operation are input into respective groups of read XOR trees 320-1 to 320-8 to generate respective groups of syndromes 330-1 to 330-8. For a codeword with errors, the pattern of errors is called the (error) syndrome and identifies the bits in error. The Hamming codes can be decoded using a syndrome decoding method. In a syndrome decoding method, the syndrome is calculated by multiplying the received codeword with the transpose of a parity-check matrix. The parity-check matrix will be described in detail below. The syndrome calculation circuit can be implemented as exclusive OR (XOR) trees. Each XOR tree has as inputs multiple data bits.

Specifically, the word 210'-1 and the first level check bits 230-1 are input into the group of read XOR trees 320-1, and the group of syndromes 330-1 are generated; the word 210'-2 and the first level check bits 230-2 are input into the group of read XOR trees 320-2, and the group of syndromes 330-2 are generated; the word 210'-3 and the first level check bits 230-3 are input into the group of read XOR trees 320-3, and the group of syndromes 330-3 are generated; the word 210'-4 and the first level check bits 230-4 are input into the group of read XOR trees 320-4, and the group of syndromes 330-4 are generated; the word 210'-5 and the first level check bits 230-5 are input into the group of read XOR trees 320-5, and the group of syndromes 330-5 are generated; the word 210'-6 and the first level check bits 230-6 are input into the group of read XOR trees 320-6, and the group of syndromes 330-6 are generated; the word 210'-7 and the first level check bits 230-7 are input into the group of read XOR trees 320-7, and the group of syndromes 330-7 are generated; and the word 210'-8 and the first level check bits 230-8 are input into the group of read XOR trees 320-8, and the group of syndromes 330-8 are generated.

The multiplication of any valid codeword with the transpose of the parity-check matrix is equal to zero. Therefore, if there is no error in the received codewords, the syndromes are all equal to zero. Specifically, when all the groups of syndromes 320-1 to 320-8 are equal to zero, all the words 210'-1 to 210'-8 are determined to be valid. When any of the groups of syndromes 320-1 to 320-8 is not equal to zero, the corresponding word (e.g., 210'-1) is determined to be invalid. However, in order to reconstruct the original 512 data bits 210, the whole second level codeword (i.e., the data bits 210', the first level check bits 230-1 to 230-8, and the second level check bits 250) is used. Specifically, in the second level ECC 204, the error correction module 116 uses the whole second level codeword (i.e., the data bits 210', the first level check bits 230-1 to 230-8, and the second level check bits 250) to reconstruct the original 512 data bits 210 with DEC. Specifically, the second level error detection module 114 can identify an error by comparing the received codeword to the original codeword, thus figuring out which data bit got flipped (i.e., from 0 to 1, or from 1 to 0). The error correction module 116 then correct the error by inverting a logic value of the data bit based on the location of the error identified by the second level error detection module 114.

Figure 4A:
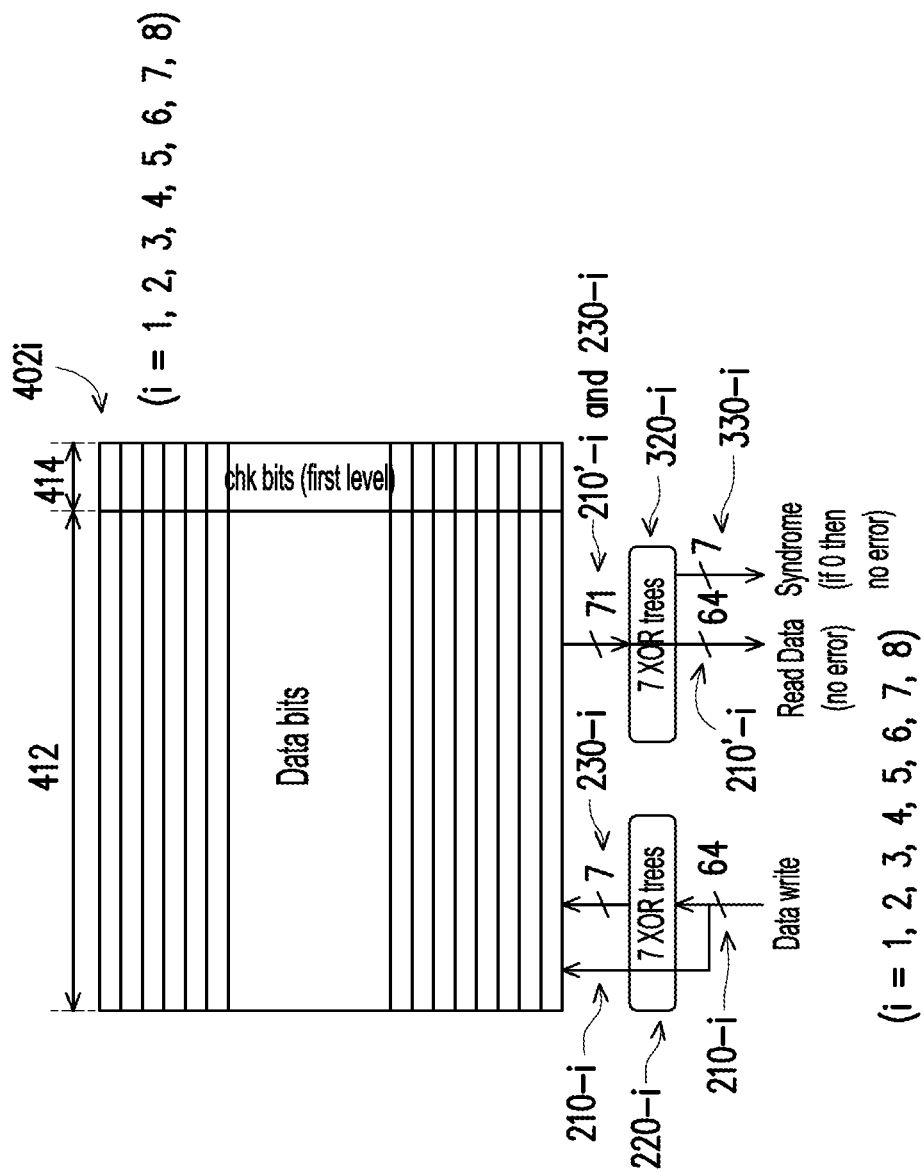
FIG. 4A is a diagram illustrating an example memory array in accordance with some embodiments.

FIG. 4A is a diagram illustrating an example memory array 402i in accordance with some embodiments. In general, the first level ECC 202 is for smaller data width, which usually is the width of a physical memory array. In the illustrated example in FIG. 4A, eight memory arrays 402i (i=1, 2, 3, 4, 5, 6, 7, 8) correspond to eight 64-bit words 210-1 to 210-8 in FIG. 2. Each memory array 402i can store 64 data bits 210-i in a data bits region 412 and 7 check bits 230-i in a check bits region 414. In the write operation as described above, the 7 check bits 230-i are generated by the group of read XOR trees 220-i, and the 64 data bits 210-i along with the 7 check bits 230-i are stored in the memory array 402i. In the read operation as described above, the 71 bits stored (including 64 data bits 210'-i and 7 check bits 230-i) are read from the memory array 402i. The group of read XOR trees 320-i generate the group of syndromes 330-i by multiplying the received codeword with the transpose of the parity-check matrix. When none of the group of syndromes 330-i is equal to zero, the 64 data bits 210'-i are determined to be valid (i.e., the 64 data bits 210'-i are the same as the 64 data bits 210-i). When any of the group of syndromes 330-i is not equal to zero, the 64 data bits 210'-i are determined to be invalid (i.e., the 64 data bits 210'-i are not the same as the 64 data bits 210-i, and the error correction in the second level ECC 204 is used). As such, eight memory arrays 402i (i=1, 2, 3, 4, 5, 6, 7, 8) fulfill the read operation and the write operation.

Figure 4B:
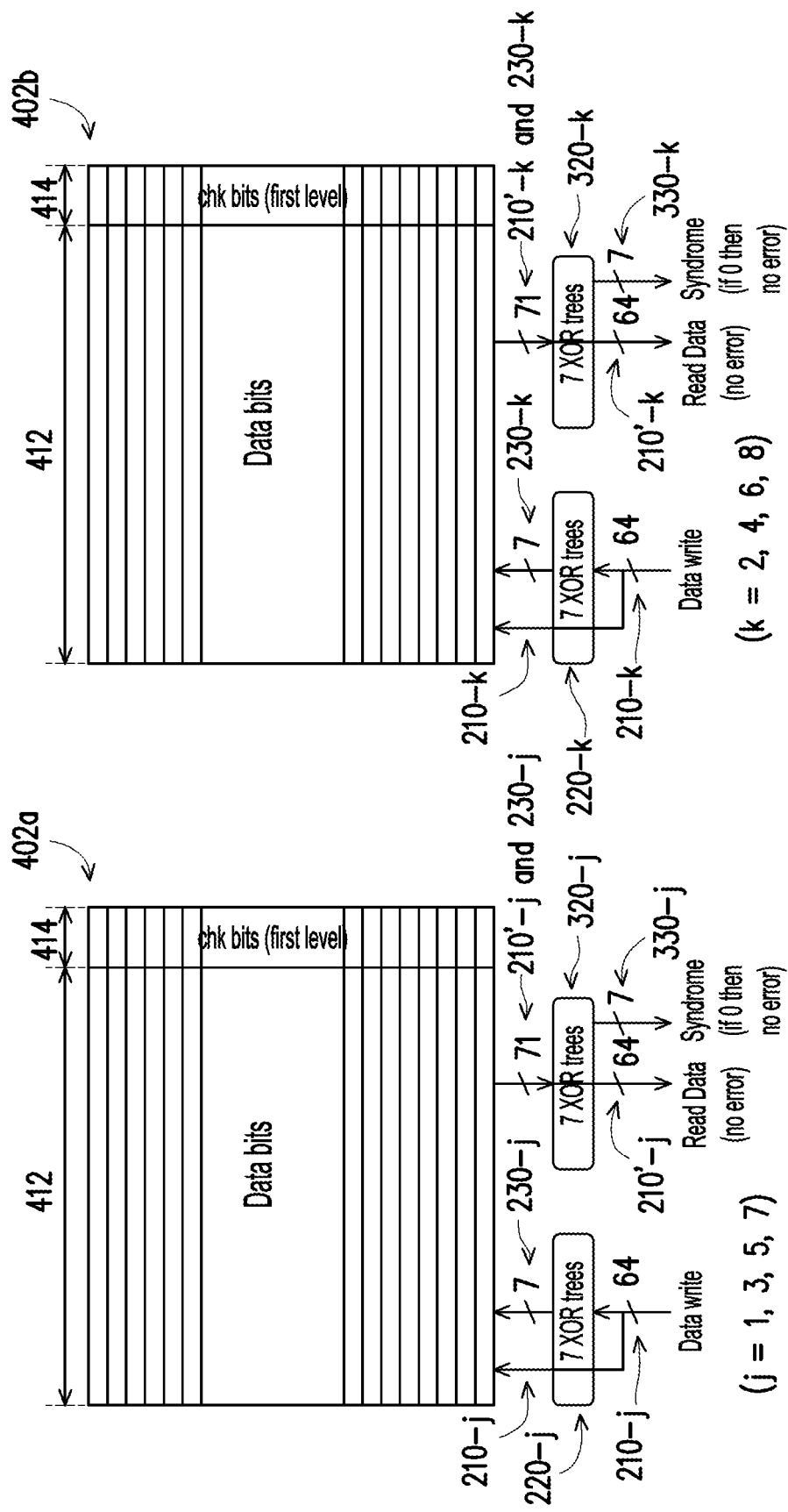
FIG. 4B is a diagram illustrating two example memory arrays in accordance with some embodiments.

FIG. 4B is a diagram illustrating two example memory arrays 402a and 402b in accordance with some embodiments. In the illustrated example in FIG. 4B, each of the two memory arrays 402a and 402b corresponds to four 64-bit words in FIG. 2. Specifically, the memory array 402a corresponds to four 64-bit words 210-j (j=1, 3, 5, 7); the memory array 402b corresponds to another four 64-bit words 210-k (k=2, 4, 6, 8). In general, both the memory array 402a and the memory array 402b are accessed four times. As such, four accesses for two memory arrays 402a and 402b each can store 512 (i.e., 512=2×4×64) data bits, which is equivalent to the situation shown in FIG. 4A where eight memory arrays are accessed once. Less memory arrays are needed for the read operation and the write operation for the same number of data bits by using multiple accesses. Both memory arrays 402a and 402b can store 64 data bits 210-j and 210k respectively in a data bits region 412 and 7 check bits 230-j and 230-k respectively in a check bits region 414. Take the memory array 402a as an example, and the operation of the memory array 402b is similar to that of the memory array 402a. In the write operation as described above, the 7 check bits 230-j (j=1, 3, 5, 7) are generated by the group of read XOR trees 220-j, and the 64 data bits 210-j along with the 7 check bits 230-j are stored in the memory array 402a. In the read operation as described above, the 71 bits stored (including 64 data bits 210'-j and 7 check bits 230-j) are read from the memory array 402a. The group of read XOR trees 320-j generate the group of syndromes 330-j. When none of the group of syndromes 330-j is equal to zero, the 64 data bits 210'-j are determined to be valid (i.e., the 64 data bits 210'-j are the same as the 64 data bits 210-j). When any of the group of syndromes 330-j is not equal to zero, the 64 data bits 210'-j are determined to be invalid (i.e., the 64 data bits 210'-j are not the same as the 64 data bits 210-j, and the error correction in the second level ECC 204 is used). As such, two memory arrays 402a and 402b can fulfill the read operation and the write operation by multiple (four times in this example) accesses. It should be noted that one memory array with eight accesses can also fulfill the read operation and the write operation. As such, eight accesses for one memory array can also store 512 (i.e., 512=8×1×64) data bits, which is equivalent to the situation shown in FIG. 4A where eight memory arrays are accessed once. Fewer memory arrays are needed for the read operation and the write operation for the same number of data bits by using multiple accesses.

Figure 5:
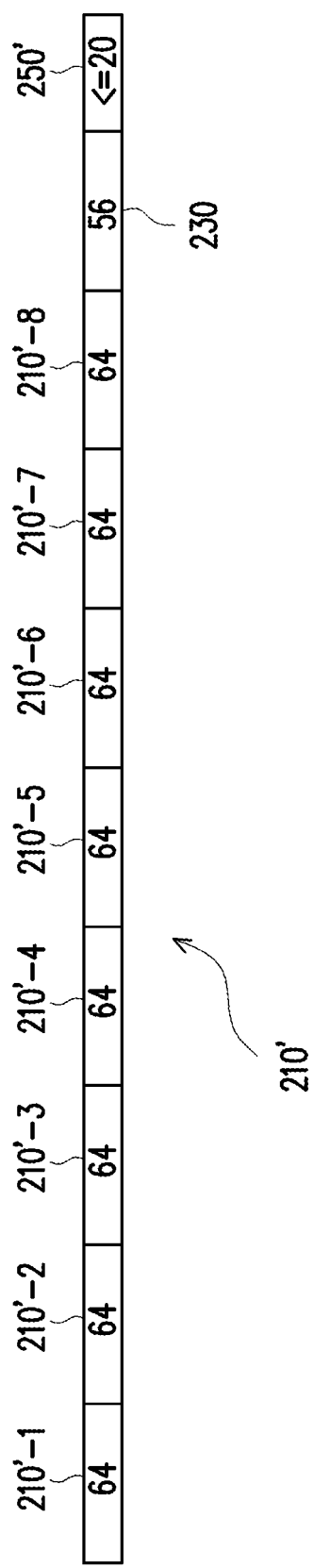
FIG. 5 is a diagram illustrating data bits and check bits with sharing of check bits among the first level ECC and the second level ECC in accordance with some embodiments.

FIG. 5 is a diagram illustrating data bits 210' and check bits 230 and 250' with sharing of check bits among the first level ECC 202 and the second level ECC 204 in accordance with some embodiments. In general, a parity matrix P is used to generate check bits and is derived from a parity-check matrix H. The parity-check matrix H of ECC is a matrix which describes the linear relations that the components of a codeword must satisfy. The parity-check matrix H can be used to decide whether a particular vector is a codeword. The parity-check matrix H can also be used in decoding algorithms. A generator matrix G is a matrix whose rows form a basis for a linear code. The codewords are all of the linear combination of the rows of the generator matrix G. The parity matrix P is derived from the parity-check matrix H with the help of the generator matrix G. Check bits are generated by multiplying the data bits with the parity matrix P.

For a two-level ECC as shown in FIG. 2, a first level parity-check matrix $H_1$ is for the first level ECC 202, and a second level parity-check matrix $H_2$ is for the second level ECC 204. Some rows of a systematic form $H_2'$ of the second level parity-check matrix $H_2$ can be reconstructed by a linear combination of rows of a systematic form $H_1'$ of the first level parity-check matrix $H_1$, thus some second level check bits do not need to be stored since they can be constructed from $H_2'$. As such, the check bits for the first level ECC 202 and the check bits for the second level ECC 204 are shared because of the reconstruction of the rows of the systematic form $H_2'$. The sharing of check bits among the first level ECC 202 and the second level ECC 204 can further reduce the overhead. The method of sharing check bits among the first level ECC 202 and the second level ECC 204 will be described in detail with reference to FIGS. 6A and 6B.

In the illustrated example in FIG. 5, 512 data bits 210' are stored in the memory device 102. 56 first level check bits are stored in the memory device 102. The second level check bits 250' stored in the memory device 102 are less than 20 bits due to sharing of check bits among the first level ECC 202 and the second level ECC 204.

Figure 6A:
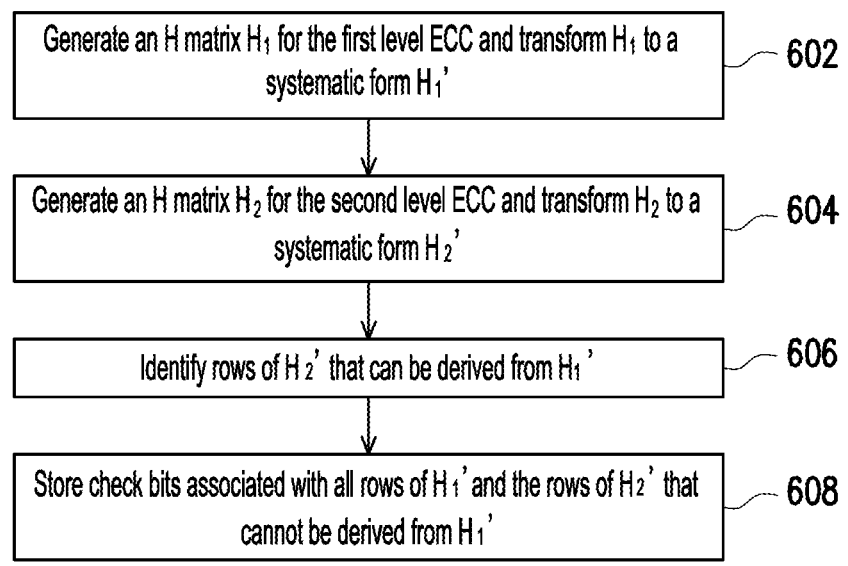
FIG. 6A is a flowchart illustrating a method of sharing check bits among the first level ECC and the second level ECC in accordance with some embodiments.

FIG. 6A is a flowchart illustrating a method of sharing check bits among the first level ECC 202 and the second level ECC 204 in accordance with some embodiments. At step 602, an H matrix $H_1$ for the first level ECC 202 is generated, and $H_1$ is transformed to a systematic form $H_1'$. $H_1'$ corresponds to a small data width. In the example of DED in FIG. 2, the data width is 64-bit and the check bit width is 7-bit. At step 604, an H matrix $H_2$ for the second level ECC 204 is generated, and $H_2$ is transformed to a systematic form $H_2'$. $H_2'$ corresponds to a large data width. In the example of DEC in FIG. 2, the data width is 568-bit and the check bit width is 20-bit. At step 606, rows of $H_2'$ that can be derived from $H_1'$ are identified. In one example, four rows can be derived from $H_1'$. At step 608, check bits associated with all rows of $H_1'$ and the rows of $H_2'$ that cannot be derived from $H_1'$ are stored. In one example, 56 check bits associated with all rows of $H_1'$ are stored, and 16 check bits associated with the rows of $H_2'$ that cannot be derived from $H_1'$ are stored.

Figure 6B:
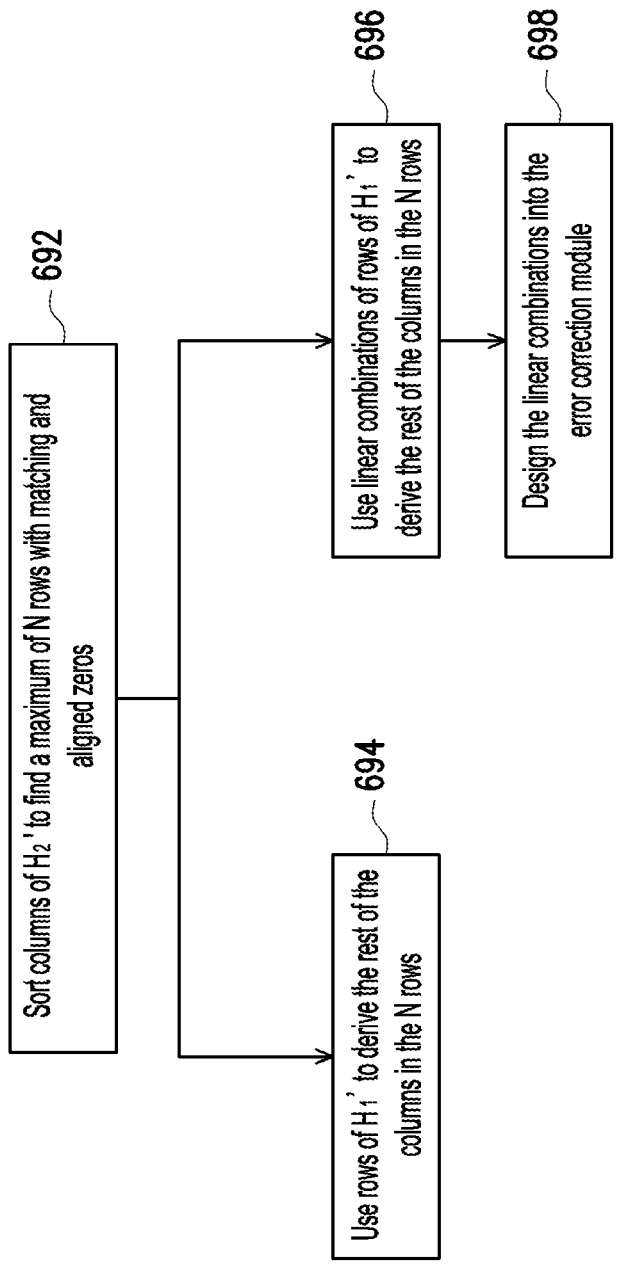
FIG. 6B is a flowchart illustrating specific steps of the step 606 of FIG. 6A in accordance with some embodiments.

FIG. 6B is a flowchart illustrating specific steps of the step 606 of FIG. 6A in accordance with some embodiments. At step 692, columns of $H_2'$ are sorted to find a maximum of N rows with matching and aligned zeros. In one example, N is 4. The method proceeds to either step 694 or step 696. At step 694, rows of $H_1'$ are used to derive the rest of the columns (i.e., non-zero elements) in the N rows. In the example of FIG. 2, the rest of the columns consist of 8 groups of $H_1'$. Alternatively at step 696, linear combinations of rows of $H_1'$ are used to derive the rest of the columns (i.e., non-zero elements) in the N rows. Then at step 698, the linear combinations are designed into the error correction module 116. As such, those N rows can be derived from $H_1'$ and check bits associated with those N rows do not need to be stored.

In accordance with some disclosed embodiments, a method of operating a memory controller coupled to a memory device is provided. The method includes: generating a first plurality of first level check bits corresponding to data bits to be written to the memory device based on a first error detection scheme; and generating a second plurality of second level check bits corresponding to both the data bits and the first plurality of first level check bits based on a first error correction scheme.

In accordance with some disclosed embodiments, a memory system is provided. The memory system includes: a memory device configured to store data bits to be written to the memory device; and a memory controller. The memory controller includes: a first level error correction code (ECC) circuit coupled to the memory device, wherein the first level ECC circuit has a first error detection scheme and is configured to generate a first plurality of first level check bits based on the data bits and the first error detection scheme, the first plurality of first level check bits being used for a first level error detection; and a second level ECC circuit coupled to the memory device, wherein the second level ECC circuit has a first error correction scheme and is configured to generate a second plurality of second level check bits based on the data bits, the first plurality of first level check bits, and the first error correction scheme, the second plurality of second level check bits used for a second level error correction.

In accordance with some disclosed embodiments, a method of sharing check bits among a first level error correction code (ECC) and a second level ECC is provided. The method includes: generating a first level parity-check matrix associated with a first error detection scheme in the first level ECC; transforming the first level parity-check matrix to a systematic form of the first level parity-check matrix; generating a second level parity-check matrix associated with a first error correction scheme in the second level ECC; transforming the second level parity-check matrix to a systematic form of the second level parity-check matrix; identifying rows of the systematic form of the second level parity-check matrix that can be derived from the systematic form of the first level parity-check matrix; and storing check bits associated with all rows of the systematic form of the first level parity-check matrix and rows of the systematic form of the second level parity-check matrix that cannot be derived from the systematic form of the first level parity-check matrix.

This disclosure outlines various embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method of operating a memory controller coupled to a memory device, comprising:
   receiving, at the memory controller, a first word of data bits to be written to the memory device;
   inputting the first word as segments of small words that are smaller than the first word into a first level error correction code (ECC) circuit implementing only an error detection scheme;
   generating a first plurality of first level check bits based on the error detection scheme applied to each of the small words;
   inputting the first word and the first plurality of first level check bits into a second level ECC circuit implementing an error correction scheme; and
   generating a second plurality of second level check bits based on the error correction scheme applied to the first word and the first plurality of first level check bits.

2. The method of claim 1, further comprising:
   storing the first word of data bits in the memory device.

3. The method of claim 2, further comprising:
   storing the first plurality of first level check bits and the second plurality of second level check bits in the memory device.

4. The method of claim 3, further comprising:
   reading the stored first word of data bits;
   reading the first plurality of first level check bits; and
   calculating a first plurality of syndromes based on the stored first word of data bits and the first plurality of first level check bits.

5. The method of claim 4, further comprising:
   if any of the first plurality of syndromes is not equal to zero, correcting the stored first word of data bits by applying the error correction scheme to the stored first word of data bits, the first plurality of first level check bits, and the second plurality of second level check bits.

6. The method of claim 1, further comprising:
   generating a third plurality of second level check bits based on the first plurality of first level check bits and the second plurality of second level check bits.

7. A memory system, comprising:
   a memory device configured to store a first word of data bits to be written to the memory device; and
   a memory controller, the memory controller comprising:
   a first level error correction code (ECC) circuit coupled to the memory device, wherein the first level ECC circuit has only an error detection scheme and is configured to receive the first word as segments of small words that are smaller than the first word, and to generate a first plurality of first level check bits based on the error detection scheme applied to each of the small words, the first plurality of first level check bits being used for a first level error detection; and
   a second level ECC circuit coupled to the memory device, wherein the second level ECC circuit has a first an error correction scheme and is configured to receive the first word and the first plurality of first level check bits, and to generate a second plurality of second level check bits based on the error correction scheme applied to the first word and the first plurality of first level check bits, the second plurality of second level check bits used for a second level error correction.

8. The memory system of claim 7, wherein the error detection scheme is a double-error detection (DED), and the error correction scheme is a double-error correction (DEC).

9. The memory system of claim 7, wherein the error detection scheme is a single-error detection (SED), and the error correction scheme is a single-error correction (SEC).

10. The memory system of claim 7, wherein the error detection scheme is a single-error detection (SED), and the error correction scheme is a double-error correction (DEC).

11. The memory system of claim 7, wherein the memory device is one of magnetic random access memory (MRAM), ferroelectric random access memory (FRAM), resistive random access memory (RRAM), or phase-change random access memory (PRAM).

12. The memory system of claim 7, wherein the first level ECC circuit is further configured to:
    read the stored first word of data bits;
    read the first plurality of first level check bits; and
    calculate a first plurality of syndromes based on the stored first word of data bits and the first plurality of first level check bits.

13. The memory system of claim 12, wherein the second level ECC circuit is further configured to:
    correct the stored first word of data bits by applying the error correction scheme to the stored first word of data bits, the first plurality of first level check bits, and the second plurality of second level check bits, when any of the first plurality of syndromes is not equal to zero.

14. The memory system of claim 7, wherein the memory controller is configured to generate a third plurality of second level check bits based on the first plurality of first level check bits and the second plurality of second level check bits.

15. The memory system of claim 7, wherein each small word corresponds to a subset of the first plurality of first check bits.

16. The memory system of claim 15, wherein the small words are written and read through accessing one memory array of the memory device multiple times.

17. The memory system of claim 15, wherein the small words are written and read through accessing multiple memory arrays of the memory device once.

18. A method comprising:
    receiving, at a first level ECC circuit, a first word to be written to a memory device, the first level ECC circuit including a first number of first write circuits corresponding with a number of small words within the first word, wherein the small words are smaller than the first word;
    applying an error detection scheme with the first level ECC circuit by applying each small word to a respective first write circuit, wherein the first level ECC circuit does not implement an error correction scheme;
    generating a first plurality of first level check bits based on an error detection scheme applied to each of the small words with the first number of first write circuits;
    receiving, at a second level ECC circuit, the first word and the first plurality of first level check bits, the second level ECC circuit including a second number of second write circuits based on a data size of the first word, a data size of the first plurality of first level check bits, and an error correction scheme implemented in the second level ECC circuit;
    applying the error correction scheme with the second level ECC circuit by applying the first word and the first plurality of first level check bits to the second write circuits;

generating a second plurality of second level check bits based on the error correction scheme applied to the first word and the first plurality of first level check bits;

storing the first word, the first plurality of first level check bits, and the second plurality of second level check bits in the memory device;

performing a read operation on the stored first word;

detecting, with the first level ECC circuit, whether the stored first word includes an error by applying each small word of the stored first word and corresponding first level check bits to a respective first read circuit of the first level ECC circuit; and in response to detecting the stored first word includes an error, reconstructing the first word by applying the stored first word, the first plurality of first level check bits, and the second plurality of second level check bits to the second level ECC circuit implementing the error correction scheme.

19. The method of 18, wherein:

the error detection scheme of the first level ECC circuit is configured to detect errors in the first word and cannot reconstruct the first word; and the error correction scheme of the second level ECC circuit is configured to reconstruct the first word.

20. The method of 18, wherein:

each of the small words is of a same size, the size of each of the small words corresponding with a width of a physical array of the memory device; and a size of the first word corresponds with a width of a cache line, the cache line being a unit of data transfer between a cache and the memory device.

* * * * *